US008948011B2

(12) United States Patent
Lamb et al.

(10) Patent No.: US 8,948,011 B2
(45) **Date of Patent: *Feb. 3, 2015**

(54) PSEUDO-RELATIVE MODE WRED/TAIL DROP MECHANISM

(71) Applicants: Joe Lamb, Hopkington, MA (US); Benjamin Findlen, Shrewsbury, MA (US)

(72) Inventors: Joe Lamb, Hopkington, MA (US); Benjamin Findlen, Shrewsbury, MA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/873,794

(22) Filed: Apr. 30, 2013

(65) Prior Publication Data

US 2013/0235725 A1 Sep. 12, 2013

Related U.S. Application Data

(63) Continuation of application No. 12/135,617, filed on Jun. 9, 2008, now Pat. No. 8,441,925.

(51) Int. Cl.

| | |
|---|---|
| ***G01R 31/08*** | (2006.01) |
| ***G06F 11/00*** | (2006.01) |
| ***H04L 12/863*** | (2013.01) |
| ***H04L 12/801*** | (2013.01) |

(52) U.S. Cl.

CPC .............. *H04L 47/623* (2013.01); *H04L 47/10* (2013.01); *G01R 31/08* (2013.01)

USPC .......................................... 370/235; 370/229

(58) Field of Classification Search

CPC ................................ G01R 31/08; H04L 47/10

USPC .................................................. 370/229, 235

See application file for complete search history.

(56) References Cited

U.S. PATENT DOCUMENTS

| | | | | |
|---|---|---|---|---|
| 6,252,848 | B1 | 6/2001 | Skirmont | |
| 6,675,220 | B1 | 1/2004 | Bergamasco et al. | |
| 6,721,796 | B1 | 4/2004 | Wong | |
| 6,904,015 | B1 * | 6/2005 | Chen et al. | 370/235 |
| 6,961,307 | B1 | 11/2005 | Aweya et al. | |
| 6,980,516 | B1 | 12/2005 | Wibowo et al. | |
| 7,369,500 | B1 | 5/2008 | Gallagher et al. | |
| 8,441,925 | B1 * | 5/2013 | Lamb et al. | 370/229 |
| 2003/0016625 | A1 | 1/2003 | Narsinh et al. | |

OTHER PUBLICATIONS

Co-Pending U.S. Appl. No. 12/135,617, filed Jun. 9, 2008, entitled "Pseudo-Relative Mode WRED/Tail Drop Mechanism" by Joe Lamb et al., 28 pages.

(Continued)

*Primary Examiner* — Omar Ghowrwal
*Assistant Examiner* — Gbemileke Onamuti
(74) *Attorney, Agent, or Firm* — Harrity & Harrity, LLP

(57) ABSTRACT

A buffer memory can be configured to temporarily store data in a number of queues. A processor can be configured to measure a fullness of the buffer memory. The processor can be configured to adjust thresholds and drop profiles based on a measured global resource usage for a weighted random early detection (WRED) technique with less resources than a conventional.

20 Claims, 8 Drawing Sheets

(56) References Cited

OTHER PUBLICATIONS

Wang et al., "Refined Design of Random Early Detection Gateways," Real-Time Computing Laboratory, Dept. of Electrical Engineering and Computer Science, University of Michigan, 1999, 7 pages.
Lin et al., "Dynamics of Random Early Detection," Division of Engineering and Applied Sciences, Harvard University, Sep. 1997, 11 pages.
Floyd et al., "Random Early Detection Gateways for Congestion Avoidance," Lawrence Berkeley Laboratory, University of California, Aug. 1993, 22 pages.
B. Braden et al., "Recommendations on Queue Management and Congestion Avoidance in the Internet," Networking Word Group, Apr. 1998, 17 pages.
Ott et al., "SRED: Stabilized RED," Mar. 1999, 10 pages.

* cited by examiner

235

Region 1
Region 2
Region 3
Region 4
Region 5
Region 6
Region 7
Region 8

Fig. 3

PSEUDO-RELATIVE MODE WRED/TAIL DROP MECHANISM

CROSS-REFERENCE TO RELATED APPLICATIONS

This application is a continuation of U.S. patent application Ser. No. 12/136,617, field Jun. 9, 2008, the content of which is incorporate herein by reference in full.

STATEMENTS REGARDING FEDERALLY SPONSORED RESEARCH OR DEVELOPMENT

N/A

REFERENCE TO A MICROFICHE APPENDIX

N/A

BACKGROUND OF THE INVENTION

1. Field of the Invention

The present invention relates generally to data communication and, more particularly, to systems and methods for performing weighted random early detection (WRED) in a data forwarding sub-system.

2. Description of Related Art

Network devices, such as routers, relay streams of data through a network from a source to a destination. Typically, the network devices include one or more memory subsystems to temporarily buffer data before transferring the data from the device. A network device can assign a number of queues (e.g., where a queue can be considered a logical first-in, first-out (FIFO) buffer) with which to buffer the data. In some instances, queues can be associated with characteristics of the data, such as destination interfaces (e.g., ports) of the data and/or a "class" of the data or some other combination of characteristics.

In some situations, data can build up too quickly in the queues (i.e., data is enqueued at a faster rate than it is dequeued), thereby causing congestion. To avoid forced "tail dropping" (i.e., dropping a chunk (e.g., a packet) of data from the tail of a queue, or before it is added to the queue), network devices can proactively employ a Random Early Detection (RED) technique to randomly drop chunks of data and ease congestion in the queues. RED techniques typically involve fixed-size queues in which fixed threshold values determine when chunks of data are randomly dropped and with what probabilities.

WRED generally drop packets selectively based on IP precedence. Packets with a higher IP precedence are less likely to be dropped than packets with a lower precedence. Thus, higher priority traffic is delivered with a higher probability than lower priority traffic.

Some network devices implement WRED techniques by defining WRED rules and implement RED techniques by defining RED rules. But in such systems, the hardware or software resources needed for WRED typically cause the system to provide fewer WRED rules than RED rules. Network devices also commonly monitor various types of global resource usage, such as the amount of a buffer memory used by the queues. This allows indexing or selecting WRED rules based on usage levels to achieve a more aggressive drop profile for usage levels.

BRIEF SUMMARY OF THE INVENTION

Systems and method consistent with the principles of the invention address this and other needs by providing congestion control techniques to efficiently process and buffer data in a network device. Pseudo-relative mode allows the use of multiple tail drop rules to achieve a more aggressive drop profile for higher resource usage levels. In some embodiments, a single WRED rule provides a minimum threshold and one of several Tail rules provides the maximum threshold, with the Tail rule and the threshold it provides varying as the usage changes. As the usage increases, the Tail rule provided maximum threshold will be a smaller value resulting in a more aggressive drop profile (steeper slope) as the minimum and maximum thresholds get closer. The result is a drop profile that uses one WRED rule, one drop curve, and multiple Tail rules to provide progressively more aggressive WRED dropping as higher levels of resources are in use. In other embodiments, no WRED rules are used; instead, a minimum threshold of zero is used, together with a drop profile constructed of at least two portions.

In one embodiment, a system for providing congestion control comprises: a buffer memory configured to store data temporarily in a queue; a processor; and a storage medium configured to store instructions that when executed by the processor, cause the processor to perform actions that comprise: measuring a queue fullness as an amount of the buffer memory occupied in the queue; measuring a global resource usage; selecting a maximum threshold of a plurality of maximum thresholds responsive to the measured global resource usage; selecting a minimum threshold of a plurality of minimum thresholds responsive to at least one characteristic of the data stored in the queue; and randomly dropping data from the queue if the queue fullness exceeds the selected minimum threshold and does not exceed the selected maximum threshold.

In another embodiment, a method of providing congestion control, comprises: periodically measuring a global resource usage; periodically measuring a queue fullness as an amount occupied of a queue; assigning a maximum queue fullness threshold responsive to the measured global resource usage; assigning a minimum queue fullness threshold responsive to at least one characteristic of the data stored in the queue; and randomly dropping data from the queue if the queue fullness exceeds the minimum queue fullness threshold and does not exceed the maximum queue fullness threshold.

In another embodiment, a method of providing congestion control, comprises: periodically measuring a global resource usage; periodically measuring a queue fullness as an amount occupied of a queue; assigning a maximum queue fullness threshold responsive to the measured global resource usage; and randomly dropping data from the queue if the queue fullness exceeds the minimum queue fullness threshold and does not exceed the maximum queue fullness threshold.

BRIEF DESCRIPTION OF THE SEVERAL VIEWS OF THE DRAWINGS

The accompanying drawings, which are incorporated in and constitute a part of this specification, illustrate an implementation of apparatus and methods consistent with the present invention and, together with the detailed description, serve to explain advantages and principles consistent with the invention. In the drawings.

FIG. 3 is an exemplary fullness diagram of a portion of the memory of FIG. 2 according to one embodiment;

DETAILED DESCRIPTION OF THE INVENTION

The following detailed description of the invention refers to the accompanying drawings. Also, the following detailed description does not limit the invention. Instead, the scope of the invention is defined by the appended claims and equivalents of the recited claim limitations. Unless expressly indicated otherwise herein, the term "or" means any combination of all or any of the items listed, and the term "including," when used to begin a list of items means that the list is not exclusive.

The systems and methods disclosed below provide congestion control techniques to efficiently process and buffer chunks of data.

Figure 1:
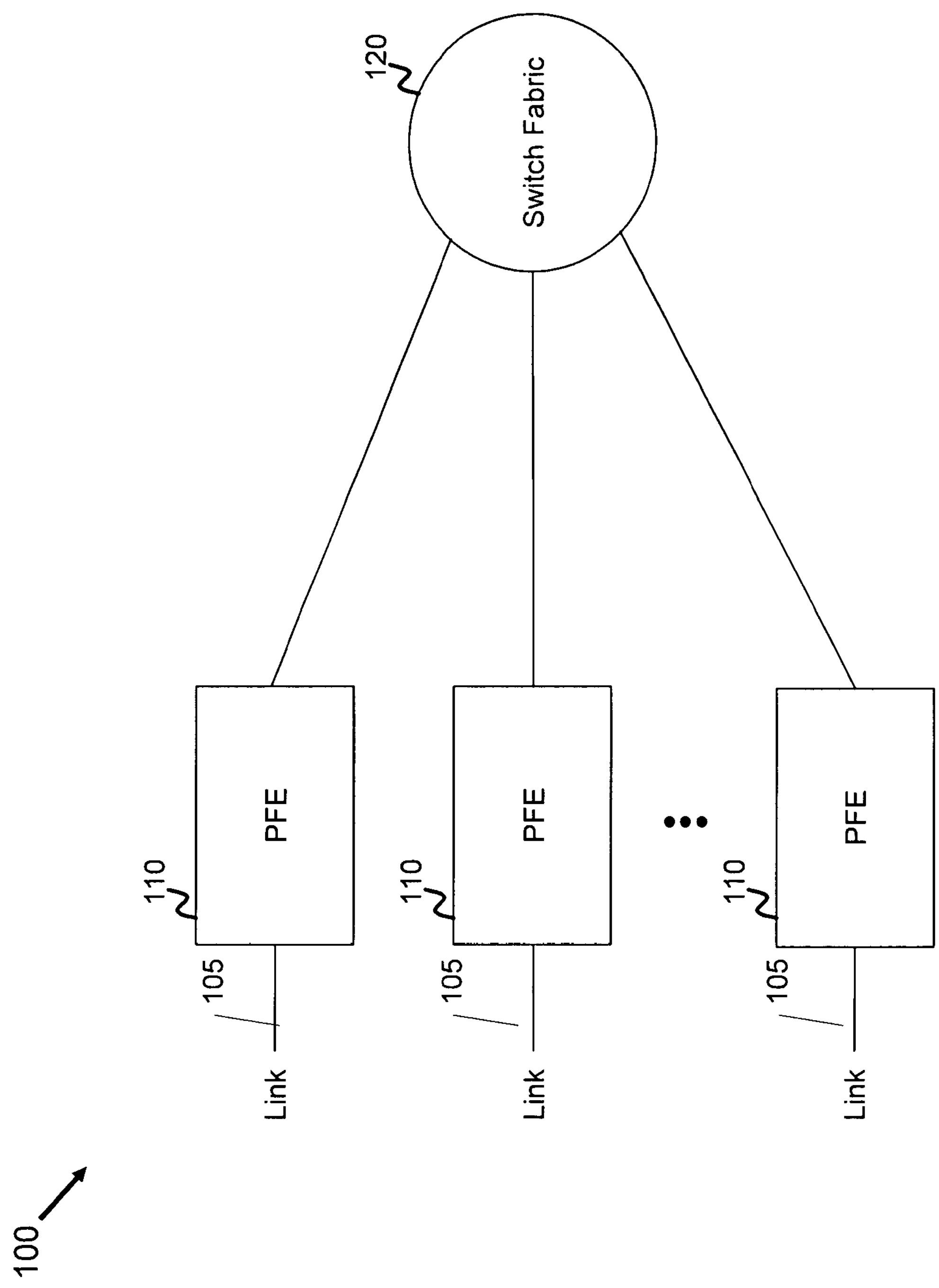
FIG. 1 is a diagram of an exemplary network device of one embodiment.

FIG. 1 is a diagram of an exemplary network device in which systems and methods consistent with the principles of the invention can be implemented. In this particular implementation, the network device takes the form of a router 100. Router 100 can receive one or more streams of data chunks from a physical link, process the stream(s) to determine destination information, and transmit the stream(s) on one or more links in accordance with the destination information.

Router 100 can include multiple packet forwarding engines (PFEs) 110 interconnected via a switch fabric 120. Switch fabric 120 can include one or more switching planes to facilitate communication between two or more of PFEs 110. In various embodiments, each of the switching planes includes a single or multi-stage switch of crossbar elements. Coordination among PFEs 110 can be accomplished by PFEs 110 themselves, by a system processor (not shown) that can be connected to PFEs 110, or a combination of these.

PFEs 110 can include forwarding tables to perform route lookup for incoming chunks of data (e.g., packets). PFEs 110 can receive data at ports on physical links 105 connected to a network, such as a wide area network (WAN), a local area network (LAN), or another network device. Each physical link 105 can be one of many types of transport media, such as optical fiber or Ethernet cable. The data on the physical link is formatted according to one of several protocols, such as the synchronous optical network (SONET) standard or Ethernet.

Figure 2:
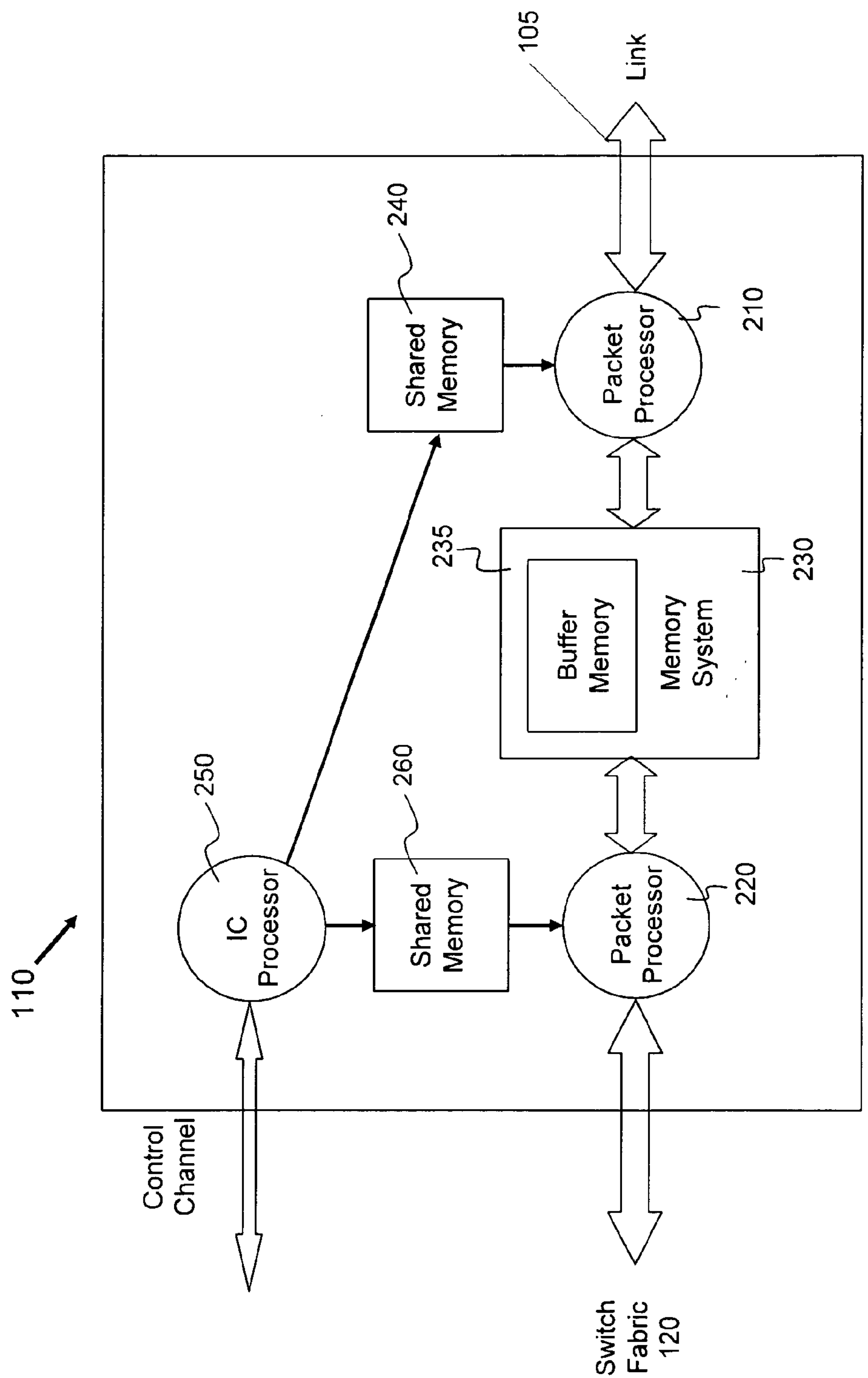
FIG. 2 is an exemplary diagram of a packet forwarding engine (PFE) of FIG. 1 according to one embodiment.

FIG. 2 is an exemplary diagram of a PFE 110 according to some embodiments. PFE 110 can include two packet processors 210 and 220, each connected to a memory system 230. PFE 110 also can include an interface controller (IC) processor 250 connected to shared memories 240 and 260, which are connected to packet processors 210 and 220, respectively. Packet processors 210 and 220 typically read routing-related information from their respective shared memories 240 and 260.

Packet processor 210 connects to one or more physical links 105. Packet processor 210 can process packets received from the incoming physical links 105 and prepare packets for transmission on the outgoing physical links 105. For example, packet processor 210 can perform route lookup based on packet header information in conjunction with information from shared memory 240 to determine destination information for the packets. Packet processor 210 also can designate a "class" of data to which a particular chunk (e.g., packet) belongs based on one or more characteristics of the data. For example, chunks of data within a certain bandwidth can be designated as high priority, while chunks that exceed this bandwidth can be given a lower priority. For packets received from the links 105, packet processor 210 can store data in memory system 230. For packets to be transmitted on the links 105, packet processor 210 can read data from memory system 230.

Packet processor 210 can include one or more circuits, such as application-specific integrated circuits (ASICs), local memory, physical interface(s) and any other parts needed to interface between the physical links 105 and memory system 230. In one embodiment, packet processor 210 can include a device (not shown) that measures an amount of memory system 230 or buffer memory 235 that is full, known as a "usage meter" or "usemeter"). Packet processor 210 can also perform a WRED function for PFE 110 that will be described in greater detail below.

Packet processor 220 connects to switch fabric 120. Packet processor 220 can include one or more circuits, such as ASICs, local memory, and any other parts needed to interface between the switch fabric 120 and memory system 230. Packet processor 220 can process packets received from switch fabric 120 and prepare packets for transmission to switch fabric 120. For packets received from switch fabric 120, packet processor 220 can store data in memory system 230. For example, such packets from switch fabric 120 can be stored in logical queues within memory system 230. For packets to be transmitted to switch fabric 120, packet processor 220 can read data from memory system 230. Although described as including different ASICs, in some embodiments, the functionality of packet processors 210 and 220 described herein can be performed by the same processor or ASIC or set of processors or ASICs. Thus, the arrangement shown in FIG. 2 conceptually illustrates the functionality of PFE 110 and does not necessarily reflect any particular, physical implementation of PFE 110.

Memory system 230 can include a buffer memory 235 for storing chunks of data from switch fabric 120 prior to transmitting them on physical links 105 according to some embodiments. Buffer memory 235 can store the chunks of data in logical queues, possibly occupying non-contiguous locations. Packet processor 220 can store the chunks of data in such queues based on, for example, an interface (e.g., a packet stream or port within an external link) to which the packet information corresponds. Other information, such as a traffic class to which the packet belongs, can be used in determining the particular queue or queues in which to store the packet information.

Figure 3:
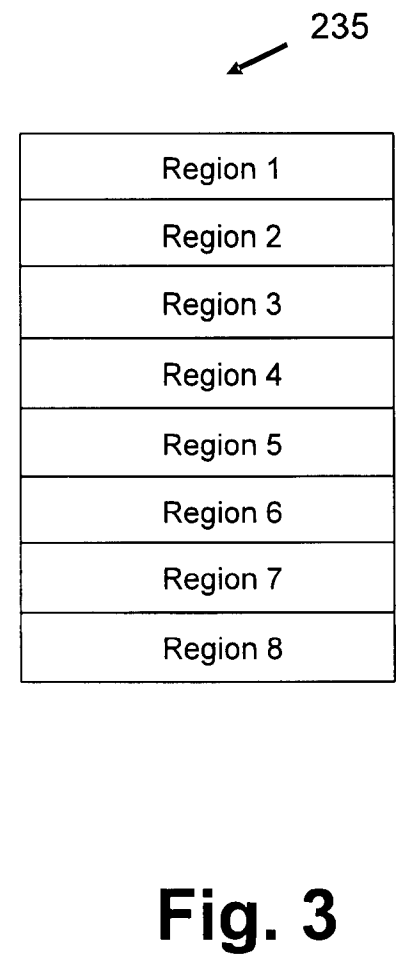

FIG. 3 is an exemplary fullness diagram for buffer memory 235 according to one embodiment. Buffer memory 235 can be implemented by a DRAM or SRAM device or any other desirable storage media. As mentioned above, the "fullness" of buffer memory 235 can be determined by a usage meter (not shown) in packet processor 210. Such a usage meter can determine an overall level of utilization of buffer memory 235 relative to a total capacity of buffer memory 235. Such "fullness" of buffer memory can be expressed with varying degrees of precision depending on the needs of PFE 110. For example, the fullness of buffer memory 235 can be measured to within a few percent of its total capacity, and such measurement can be produced by hardware or software in packet processor 210 as a percentage value, an unprocessed "raw" measurement value, or in any other desired form.

One possible technique for determining the fullness of buffer memory 235 is to map or "bin" a more precise measurement by packet processor 210 into one of a number of coarser fullness values. FIG. 3 conceptually illustrates an eight-level fullness scale for buffer memory 235. For example, if buffer memory 235 is between 0 and one-eighth full (as measured by packet processor 210), its utilization falls in Region 1 on the scale in FIG. 3. Similarly, if buffer memory 235 is between one-eighth and one-quarter full, its utilization falls in Region 2, and so on to Region 8, which indicates near-fullness of buffer memory 235. It should be noted that data in queues within buffer memory 235 need not be contiguous, nor beginning at a lowest/highest logical address within the memory, so Regions 1-8 in FIG. 3 do not necessarily correspond to the location(s) of usage within buffer memory 235. Rather, Regions 1-8 in FIG. 3 illustrate a coarse, eight-level fullness scale for buffer memory 235 that can be used to measure buffer memory 23 occupancy or fullness. A usemeter for buffer memory 235 can be implemented by storing a value of 0-8 in a register or any other suitable technique known to the art.

Returning to FIG. 2, IC processor 250 and shared memories 240 and 260 can be configured to assist the operation of packet processors 210 and 220. IC processor 250 can receive parameters for such assistance via a control channel. IC processor 250 can be configured to format and process such parameters, prior to storage in shared memory 240. Such formatting or processing can optimize the parameters for rapid retrieval from shared memory 240 or rapid use by packet processor 210.

Queues in buffer memory 235 can include a set of first-in-first-out (FIFO) logical buffers that temporarily store chunks of data that are to be transmitted from PFE 110 on one or more physical links. In one embodiment, the queues in buffer memory 235 can be associated with a particular traffic class-interface pair. For example, if PFE 110 is associated with 4,000 IP interfaces, each of which can include four traffic classes, then 16,000 queues can be created in buffer memory 235. A larger or smaller number of different queues can be created in buffer memory 235, depending on the number of destination interfaces and traffic classes. Further, different schemes of creating queues are possible, such as creating queues based only on the number of interfaces. In such a case, a particular queue can contain chunks of data belonging to different traffic classes. Moreover, queues can be created for protocols other than IP, such as the Point-to-point Protocol (PPP), or MPLS, or other suitable protocols. Queues can also be created based on interface or sub-interface types such as, for example, Ethernet VLANs, ATM VCs, ATM VPs, and Frame relay DLCIs.

Figure 4:
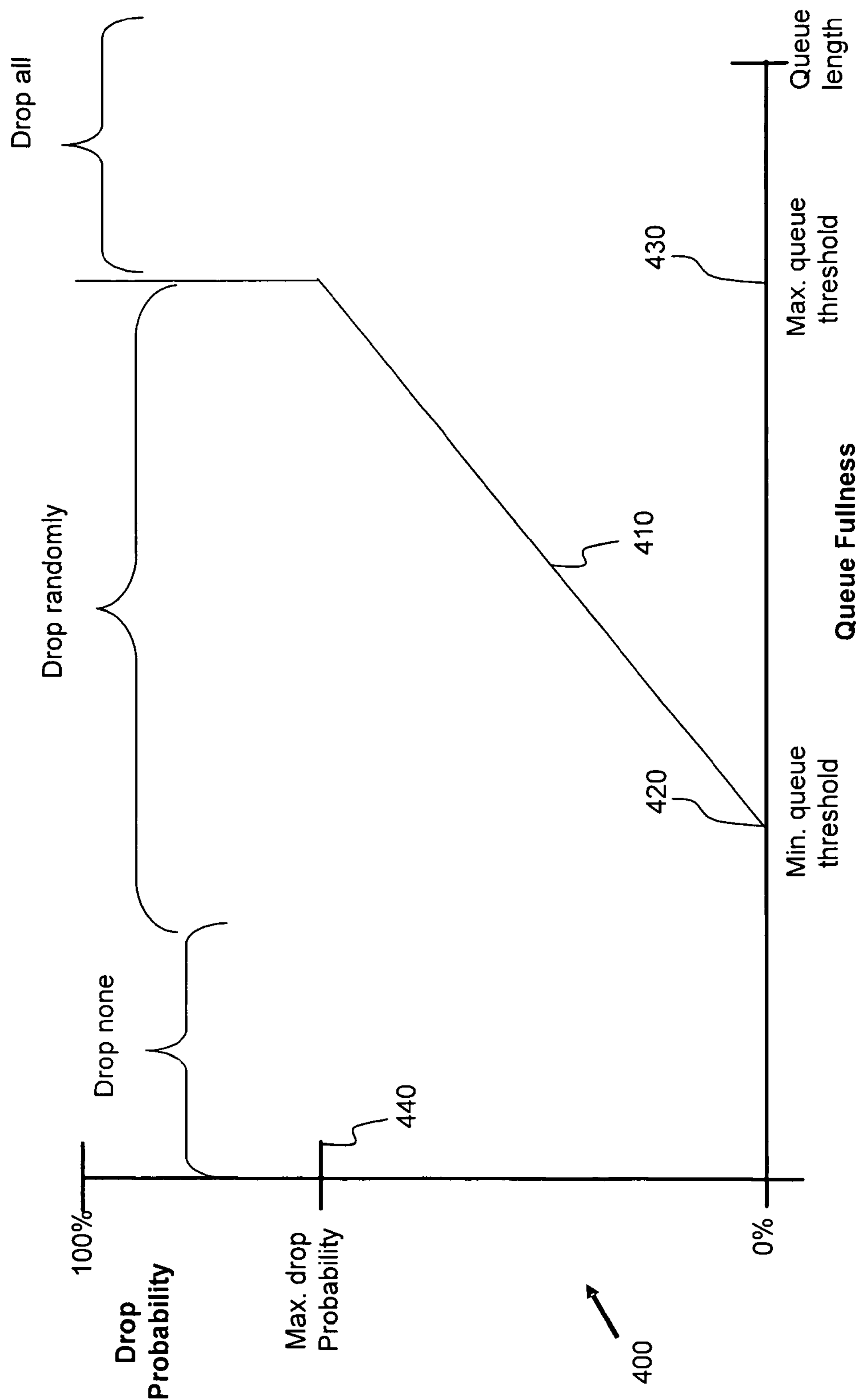
FIG. 4 is an exemplary RED drop profile.

FIG. 4 illustrates an exemplary WRED drop plot 400. Plot 400 contrasts the probability that a chunk of data will be randomly dropped from a queue with some measure of the occupancy or fullness of the queue (e.g., average queue length). Drop profile 410 specifies chunk dropping behavior due to RED for one or more queues. As shown in FIG. 4, drop profile 410 can be uniquely determined using three parameters: 1) a minimum queue threshold 420, 2) a maximum queue threshold 430, and 3) a maximum drop probability 440.

Minimum queue threshold 420 can represent a measure of queue fullness (e.g., average queue length) below which no chunks of data are dropped from the queue in buffer memory 235. When minimum queue threshold 420 is exceeded for a queue, chunks of data can be randomly dropped or tail-dropped, depending on how much the fullness of the queue exceeds minimum queue threshold 420. When minimum queue threshold 420 is not exceeded for a queue, however, the queue fills and empties normally.

Maximum queue threshold 430 can represent a measure of queue fullness (e.g., average queue length) above which all new chunks of data are tail-dropped from the queue in question. In some implementations, maximum queue threshold 430 can be less than the total length of the queue. When maximum queue threshold 430 is exceeded for a queue, no new chunks of data are added to the queue (i.e., 100% are dropped from the tail) to allow the queue to drain as fast as possible. When queue fullness (e.g., average queue length) lies between minimum queue threshold 420 and maximum queue threshold 430, packet processor 210 can randomly drop some percentage of new chunks from the tail of the queue(s).

In drop profile 510 shown in FIG. 4, the percentage of chunks of data that are randomly dropped from a queue can vary roughly linearly from zero to maximum drop probability 440 as the queue fullness (e.g., average queue length) ranges from minimum queue threshold 420 to maximum queue threshold 430. Although maximum drop probability 440 is illustrated in FIG. 4 as being somewhat closer to 100% than 0% (for example, 80%), it should be noted that maximum drop probability 440 can lie anywhere in this range and can only be, for example, 5% or 10%. Further, consistent with the principles of the invention, other ways than linearly can be used to define a drop profile 410 to vary drop probability between minimum queue threshold 420 and maximum queue threshold 430. For example, step functions, polynomial, logarithmic, and/or other increasing functions can be employed to vary drop probability between 0% and maximum drop probability 440. Moreover, in some embodiments the drop probability of drop profile 510 can have some non-zero initial value at minimum queue threshold 420.

Although the lower axis in FIG. 4 is labeled "queue fullness," a weighted fullness average (i.e., average queue length) can be employed in some embodiments to reduce sensitivity to sudden increases or decreases in queue fullness. One example of such an average fullness can be seen in the following exponential weighted moving average:

$$\text{averageFullness}=\text{averageFullness}+2^{-aveExp(currentFullness-averageFullness)}$$

where the value of aveExp can be chosen based on the speed of the link associated with the queue in question. As an example, for an OC3 link, aveExp can be set to be about 10.

Figure 5:
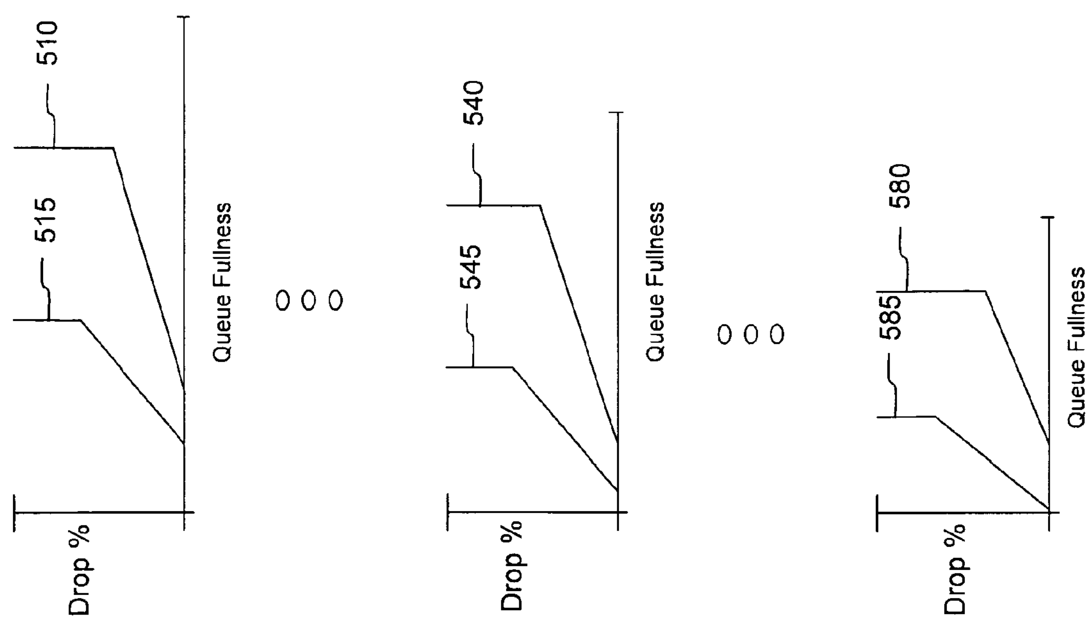
FIG. 5 is an exemplary diagram illustrating dynamic RED drop profiles that vary by type of data according to one embodiment.

FIG. 5 is an exemplary diagram illustrating dynamic WRED drop profiles 510-580 and 515-585 that vary by type of data according to some embodiments. In one embodiment, drop profiles 510-580 can be associated with a group of queues containing a type or class of data that has a relatively high priority, and drop profiles 515-585 can be associated with a group of queues containing a type or class of data that has a relatively low priority. Type or class of data are exemplary and illustrative characteristics only and any characteristic of the data can be used. Alternately or additionally, WRED drop profiles 510-580 and 515-585 can be associated with the same queue (or group of queues) that contains data of both classes. In some embodiments, greater than two data types or classes are possible for chunks of data within PFE 110 and buffer memory 235. Such data classes can include, but are not limited to, video data, multicast data, internet data, or a default classification (e.g., best effort).

Exemplary values for profiles 510-580 for high priority chunks of data can use a minimum queue threshold of 20% of the total queue length, a maximum queue threshold of 80% of the total queue length, and a maximum drop probability is 5%. By contrast, exemplary values for profiles 515-585 for lower priority chunks can cause packet processor 210 to begin to randomly drop chunks of data associated with profiles 515-585 earlier (i.e., at 10% of the total queue length) than chunks of data associated with drop profiles 510-580. Such lower priority chunks associated with profiles 515-585 can also be randomly dropped up to a lower maximum threshold (i.e., 40% of the total queue length) and can have a higher maximum drop probability (i.e., 10%) than chunks of data associated with profiles 510-580. The above numerical examples for profiles 510-580 and 515-585 in FIG. 5 are purely exemplary and illustrative, and other profiles can be used.

Figure 6:
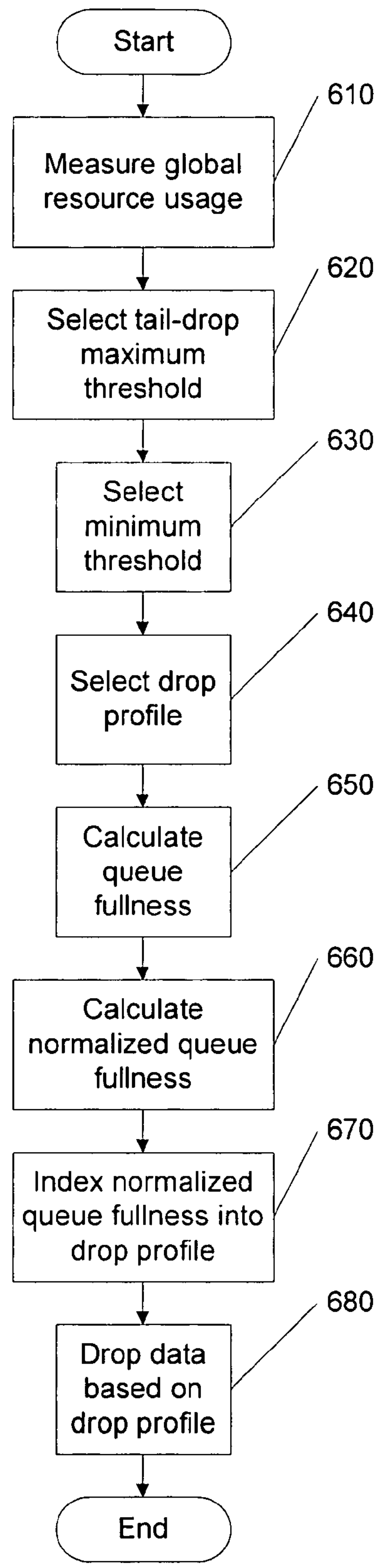
FIG. 6 is an exemplary flow chart illustrating processing according to one embodiment.

FIG. 6 is an exemplary flow chart 600 illustrating one embodiment. In block 660, a usemeter of packet processor 210 measures or calculates a global resource usage, such as the amount of buffer memory 235 in use. As described above, the usemeter can be implemented in hardware or software. Any desirable global resource can be measured in block 610.

In block 620, packet processor 210 selects a maximum threshold for use in the pseudo-relative WRED/Tail drop mechanism. In one embodiment, the maximum threshold is selected from a plurality of tail rules maintained by packet processor 210. In block 630, packet processor 210 selects a minimum threshold. In one embodiment, the minimum threshold is selected from a plurality of WRED rules maintained by the packet processor 210. In another embodiment, the minimum threshold is selected as a zero threshold.

The tail and WRED rules may be stored in shared memory 240 or in any other convenient storage mechanism.

The selection of the maximum threshold in block 620 is based on the measured global resource usage calculated in block 610. Typically, a lower maximum threshold is selected responsive to a lower global resource usage. The selection of a WRED rule in block 630 is typically based on a characteristic of the data in the queue. For example, a queue containing low priority data would typically cause the selection of a lower minimum threshold or WRED rule, and a queue with a relatively high priority would typically cause the selection of a higher minimum threshold or WRED rule.

In block 640, a drop profile is selected. In some embodiments, a single drop profile is used regardless of the selected minimum and maximum thresholds. In other embodiments, a drop profile is selected associated with the WRED rule used for the selected minimum threshold. Other techniques for selecting a drop profile can be used.

In block 650, the current queue fullness or occupancy is calculated. In some embodiments, this is the instantaneous queue length. In more preferred embodiments, weighted average queue fullness is used to reduce sensitivity to sudden changes in queue fullness, as explained above.

In some embodiments, the drop profile is implemented as a series of drop probability values stored in a range of memory locations. In those embodiments, the queue fullness value can be used to index into the drop profile if the queue fullness is normalized to one of a range of index values, such as being normalized to a 0-255 value, in block 660. Then in block 670, the normalized fullness value is used to index into the drop profile and determine a corresponding drop probability.

In block 680 packet processor 210 can drop data from the queue based on the drop probability obtained from the drop profile. If the queue fullness does not exceed the minimum threshold selected in block 630, then no chunks of data are dropped. If the queue fullness lies between the minimum and maximum threshold, packet processor 210 randomly drops chunks of data from the queues with a probability of the drop probability obtained from the drop profile. And if the queue fullness exceeds the maximum queue threshold, packet processor 210 tail drops all new chunks from the queue until the queue fullness is below the maximum threshold. This tail dropping can continue until packet processor 210 again performs block 610 to measure the global resource usage measured by the block, at which point blocks 620 through 680 are performed again, based on the updated measured global resource usage.

Figure 7:
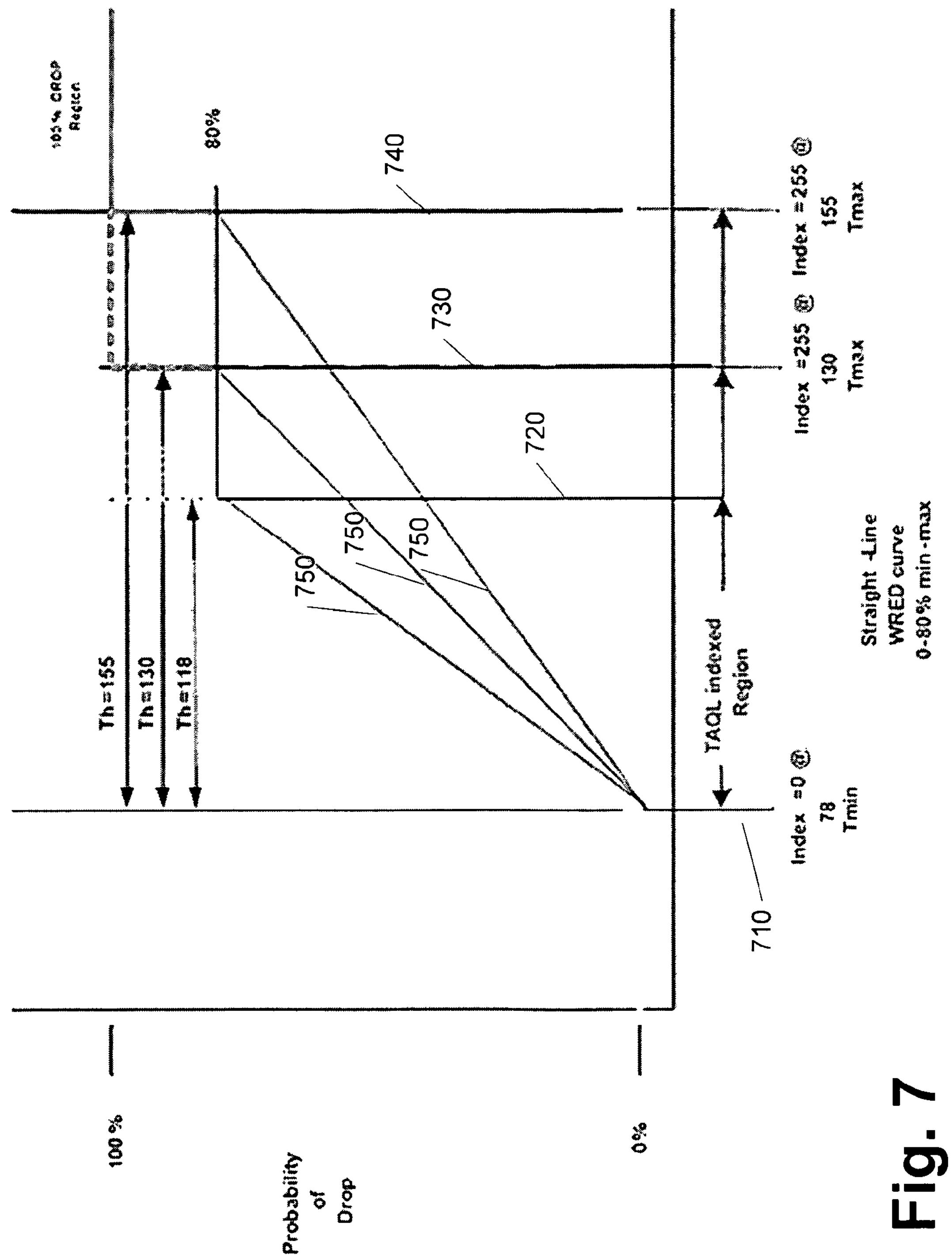
FIGS. 7 and 8 are exemplary diagrams illustrating embodiments of the technique of FIG. 6.
Figure 8:
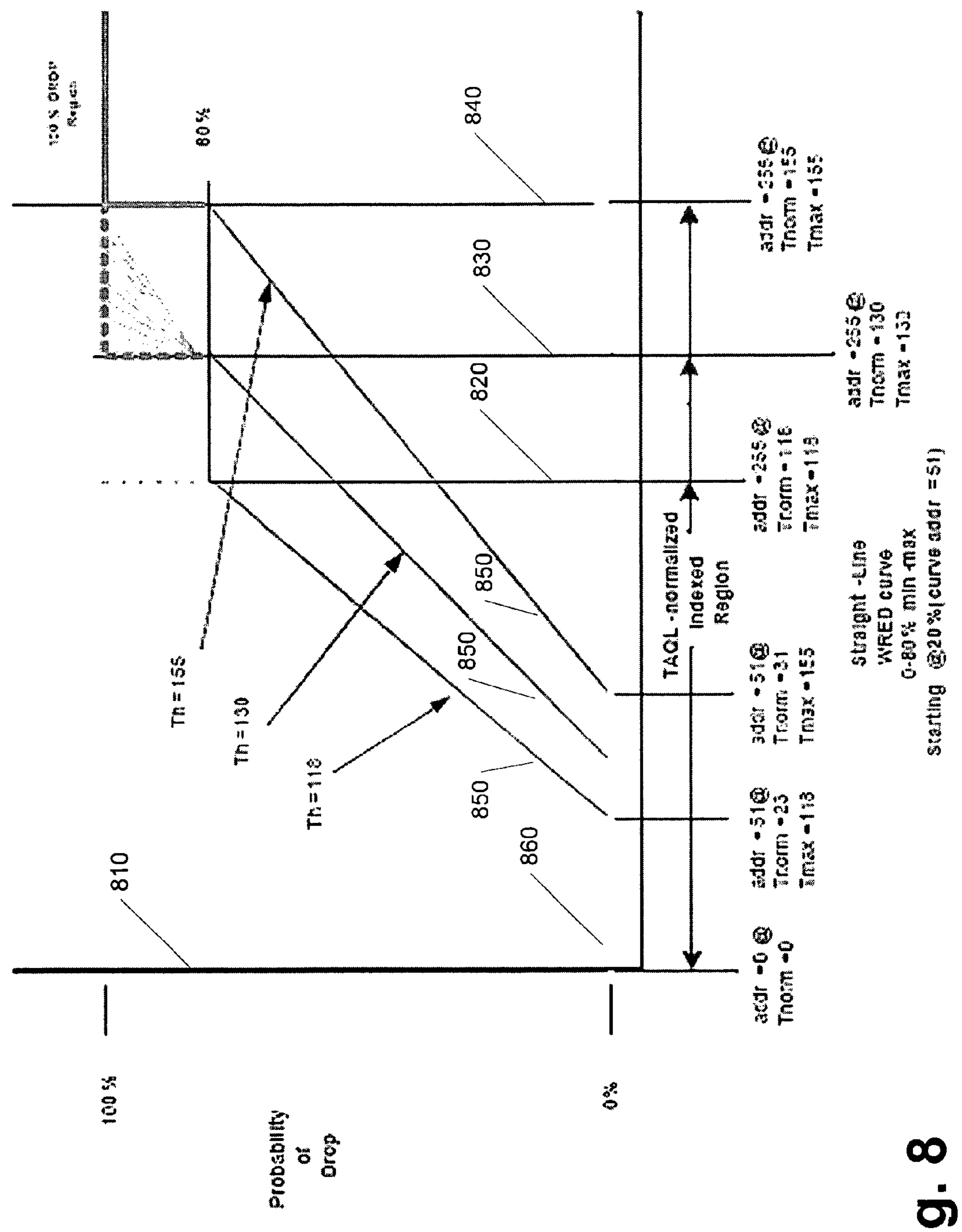

FIGS. 7 and 8 illustrate two embodiments of the technique described above. In FIG. 7, a WRED rule defines an exemplary minimum threshold of 78. Three exemplary maximum thresholds 720, 730, and 740 are defined as 118, 130, and 155, respectively. A WRED straight-line drop profile 750 is stored as a 255 element region of memory, and the average queue occupancy or fullness, and this example calculated as a Total Average Queue Length (TAQL) is normalized to a 0-255 value to index into the drop profile. At the minimum threshold 710, the drop probability of the drop profile is 0%. At the normalized TAQL value of 255, corresponding to maximum thresholds 720, 730, and 740, the drop probability is 80%, with a 100% drop region above the maximum thresholds 720, 730, and 740. As can be seen in FIG. 7, the slope of the drop profile 750 increases if a lower maximum threshold 720 is selected compared to a higher maximum threshold 940.

FIG. 8 is a chart illustrating another embodiment. In this embodiment, a minimum threshold of zero is always selected. As with FIG. 7, the drop profile is defined as a 0-255 look-up region indexed by a normalized queue fullness value. But instead of a linear drop profile as in FIG. 7, a WRED drop profile is created with two portions. The first portion 860 is defined to have a zero drop probability and is defined to extend from a normalized queue fullness of zero for a predetermined fractional distance from zero. In FIG. 8, the first portion is the lower 20% of the drop profile, which means normalized values of 0-51 would result in a drop probability of zero. This corresponds to a zero probability for fullness values of zero to approximately 23 when the maximum threshold 820 of 118 is selected, and from zero to approximately 31 when maximum threshold 840 of 130 is selected. The second portion 850 of the drop profile presents a variable range of drop probabilities from zero to 80%, with a slope that varies depending on the maximum threshold 820, 830, or 840 that is selected.

The ranges of values, drop profiles, minimum and maximum threshold values, and normalization ranges shown in FIGS. 7 and 8 are exemplary and illustrative only, and variations of those elements can be used.

The foregoing description of preferred embodiments of the present invention provides illustration and description, but is not intended to be exhaustive or to limit the invention to the precise form disclosed. Modifications and variations are possible in light of the above teachings or can be acquired from practice of the invention.

Also, while some memory elements have been described as RAMs, other types of memory devices can be used in other implementations consistent with the principles of the invention.

Certain portions of the invention have been described as "logic" or a "processor" that performs one or more functions. This logic/processor can include hardware, such as an application specific integrated circuit or a field programmable gate array, software, or a combination of hardware and software.

Also, while a series of blocks have been described with regard to certain Figs., the order of the blocks can be varied in other embodiments, and non-dependent blocks can be implemented in parallel.

No element, act, or instruction used in the description of the present application should be construed as critical or essential to the invention unless explicitly described as such. The scope of the invention is defined by the claims and their equivalents.

We claim:

1. A method comprising:

storing, by one or more processors of a network device, a plurality of drop probability values, the plurality of drop probability values being stored at a corresponding plurality of memory locations, and the plurality of drop probability values including:

a minimum drop probability value associated with a fill level of a queue being less than a first threshold, a maximum drop probability value associated with the fill level of the queue being greater than a second threshold, the second threshold being greater than the first threshold, and a plurality of intermediate drop probability values associated with the fill level of the queue being between the first threshold and the second threshold, the plurality of intermediate drop probability values being determined as a function of the fill level of the queue;

storing, by the one or more processors, a data unit to the queue;

determining, by the one or more processors, the fill level associated with the queue based on storing the data unit;

identifying, by the one or more processors, a particular memory location of the corresponding plurality of memory locations based on the fill level associated with the queue;

acquiring, by the one or more processors, a particular drop probability value, of the plurality of drop probability values, stored at the particular memory location, the particular drop probability value being the minimum drop probability value, the maximum drop probability value, or one of the plurality of intermediate drop probability values; and processing, by the one or more processors, the data unit based on the particular drop probability value.

2. The method of claim 1, where identifying the particular memory location includes:

determining an average fill level associated with a plurality of queues associated with the network device; and identifying the particular memory location based on comparing the average fill level, associated with the plurality of queues, and the fill level associated with the queue.

3. The method of claim 1, where identifying the particular memory location includes:

selecting a random early detection (RED) rule, of a plurality of RED rules, based on a type of data stored in the queue;

calculating a minimum queue fullness threshold associated with the queue based on the selected RED rule, the minimum queue fullness threshold being the first threshold; and identifying the particular memory location based on comparing the fill level and the minimum queue fullness threshold.

4. The method of claim 3, where the plurality of drop probability values are associated with a drop profile associated with the selected RED rule.

5. The method of claim 1, where identifying the particular memory location includes:

determining, based on a random early detection (RED) rule, a maximum queue fullness threshold associated with the queue, the maximum queue fullness threshold being the second threshold; and identifying the particular memory location further based on comparing the fill level and the maximum queue fullness threshold.

6. The method of claim 1, where the corresponding plurality of memory locations are associated with, respectively, a plurality of fill level ranges associated with the queue, and where identifying the particular memory location includes:

identifying a particular fill level range, of the plurality of fill level ranges, that includes the fill level associated with the queue, the particular memory location being associated with the particular fill level range.

7. The method of claim 1, where determining the fill level comprises:

determining the fill level based on storing the data unit and based on a speed of a link associated with the queue.

8. A system comprising:

a memory; and a processor to:

store a plurality of drop probability values at a corresponding plurality of memory locations in the memory, the corresponding plurality of memory locations being associated with, respectively, a plurality of fill level ranges, and the plurality of drop probability values including:

a minimum drop probability value associated with a fill level of a queue being less than a first threshold, a maximum drop probability value associated with the fill level of the queue being greater than a second threshold, the second threshold being greater than the first threshold, and a plurality of intermediate drop probability values associated with the fill level of the queue being between the first threshold and the second threshold, the plurality of intermediate drop probability values being determined as a function of the fill level of the queue, store a data unit to the queue, determine the fill level associated with the queue when the data unit is stored, identify a particular fill level range, of the plurality of fill level ranges, that includes the fill level associated with the queue, identify, based on the particular fill level range, a particular memory location of the corresponding plurality of memory locations, acquire a particular drop probability value, of the plurality of intermediate drop probability values, stored at the particular memory location and that corresponds to the fill level, and determine whether to drop the data unit based on the particular drop probability value.

9. The system of claim 8, where the processor, when identifying the particular memory location, is further to:

determine an average fill level associated with a plurality of queues associated with the system, compare the average fill level, associated with the plurality of queues, and the fill level, associated with the queue, to produce comparison results, and identify the particular memory location further based on the comparison results.

10. The system of claim 8, where the processor, when identifying the particular memory location, is further to:

select a random early detection (RED) rule, of a plurality of RED rules, based on a type of data stored in the queue, calculate a minimum queue fullness threshold associated with the queue, based on the selected RED rule, the minimum queue fullness threshold being the first threshold, and identify the particular memory location further based on comparing the fill level and the minimum queue fullness threshold.

11. The system of claim 10, where the processor, when identifying the particular memory location, is further to:

determine, based on the selected RED rule, a maximum queue fullness threshold associated with the queue, the maximum queue fullness threshold being the second threshold, and identify the particular memory location further based on comparing the fill level and the maximum queue fullness threshold.

12. The system of claim 10, where the plurality of drop probability values are associated with a drop profile associated with the selected RED rule.

13. The system of claim 8, where the plurality of drop probability values are associated with at least one of:

a corresponding plurality of random early detection (RED) rules associated with the queue, or a corresponding plurality of weighted random early detection (WRED) rules associated with the queue.

14. A non-transitory memory device to store instructions, the instructions comprising:

one or more instructions that, when executed by a processor associated with a network device, cause the processor to:

store a plurality of drop probability values at a respective plurality of memory locations, the plurality of drop probability values including:

a minimum drop probability value associated with a fill level associated with a queue being less than a first threshold, a maximum drop probability value associated with the fill level being greater than a second threshold, the second threshold being greater than the first threshold, and a plurality of intermediate drop probability values associated with the fill level being between the first threshold and the second threshold, the plurality of intermediate drop probability values being determined as a function of the fill level, store a data unit in the queue, determine the fill level based on storing the data unit, identify, based on the fill level a particular memory location of the respective plurality of memory locations, acquire a particular drop probability value, of the plurality of intermediate drop probability values, stored at the particular memory location, and process the data unit from the queue based on the particular drop probability value.

15. The non-transitory memory device of claim 14, where the one or more instructions to identify the particular memory location include:

one or more instructions that, when executed by the processor, cause the processor to:

calculate an average fill level associated with a plurality of queues associated with the network device, and identify the particular memory location based on comparing the fill level to the average fill level.

16. The non-transitory memory device of claim 14, where the instructions further include:

one or more instructions that, when executed by the processor, cause the processor to:

select a random early detection (RED) rule, of a plurality of RED rules, based on a type of data stored in the queue, and calculate the first threshold based on the selected RED rule.

17. The non-transitory memory device of claim 16, where the plurality of drop probability values are associated with a drop profile for the selected RED rule.

18. The non-transitory memory device of claim 14, where the instructions further include:

one or more instructions that, when executed by the processor, cause the processor to:

select a random early detection (RED) rule, of a plurality of RED rules, based on a type of data stored in the queue, and determine, based on the selected RED rule, the second threshold associated with the queue, and where the one or more instructions to identify the particular memory location further include:

one or more instructions that, when executed by the processor, cause the processor to:

identify the particular memory location based on comparing the fill level and the second threshold.

19. The non-transitory memory device of claim 14, where the instructions further comprise:

one or more instructions that, when executed by the processor, cause the processor to:

calculate the plurality of drop probability values as a function of the fill level of the queue.

20. The non-transitory memory device of claim 14, where the one or more instructions to process the data unit from the queue comprise:

one or more instructions that, when executed by the processor, cause the processor to:

drop the data unit based on the particular drop probability value.

* * * * *